US010335850B2

(12) United States Patent
Roberge

(10) Patent No.: US 10,335,850 B2
(45) Date of Patent: Jul. 2, 2019

(54) LIGHT WEIGHT HOUSING FOR INTERNAL COMPONENT AND METHOD OF MAKING

(71) Applicant: UNITED TECHNOLOGIES CORPORATION, Farmington, CT (US)

(72) Inventor: Gary D. Roberge, Tolland, CT (US)

(73) Assignee: UNITED TECHNOLOGIES CORPORATION, Farmington, CT (US)

(*) Notice: Subject to any disclaimer, the term of this patent is extended or adjusted under 35 U.S.C. 154(b) by 0 days.

(21) Appl. No.: 15/096,671

(22) Filed: Apr. 12, 2016

(65) Prior Publication Data

US 2017/0291214 A1 Oct. 12, 2017

(51) Int. Cl.
B21J 5/02 (2006.01)
B44C 1/22 (2006.01)
(Continued)

(52) U.S. Cl.
CPC ............... B21J 5/002 (2013.01); B23H 1/08 (2013.01); B23H 9/00 (2013.01); B23K 26/362 (2013.01); B23K 26/40 (2013.01); B23P 15/02 (2013.01); B32B 5/18 (2013.01); B32B 5/20 (2013.01); B32B 15/01 (2013.01); C23C 4/08 (2013.01); C23C 4/129 (2016.01); C23C 4/134 (2016.01); C23C 14/028 (2013.01); C23C 14/16 (2013.01); C23C 14/221 (2013.01); C23C 16/44 (2013.01); C23C 24/04 (2013.01); C23F 1/04 (2013.01);
(Continued)

(58) Field of Classification Search
None
See application file for complete search history.

(56) References Cited

U.S. PATENT DOCUMENTS 3,261,733 A * 7/1966 Bellinger .................. C23F 1/16
216/106
3,470,117 A 9/1969 Pearce
(Continued)

FOREIGN PATENT DOCUMENTS

DE 19526057 C1 4/1996
DE 202004018594 U1 2/2005
(Continued)

OTHER PUBLICATIONS

European Search Report for EP Application No. 17 16 6220.
(Continued)

Primary Examiner — Shamim Ahmed
(74) Attorney, Agent, or Firm — Cantor Colburn LLP

(57) ABSTRACT

A method of making a light weight component is provided. The method including the steps of: forming a metallic foam core into a desired configuration; inserting a pre-machined component into an opening in the metallic foam core; applying an external metallic shell to an exterior surface of the metallic foam core after it has been formed into the desired configuration and after the pre-machined component has been inserted into the metallic foam core; introducing an acid into an internal cavity defined by the external metallic shell; dissolving the metallic foam core; and removing the dissolved metallic foam core from the internal cavity, wherein the component and the external metallic shell are resistant to the acid.

18 Claims, 12 Drawing Sheets

(51) Int. Cl.

| | | |
|---|---|---|
| B21J 5/00 | (2006.01) | |
| B23H 9/00 | (2006.01) | |
| B23H 1/08 | (2006.01) | |
| B23K 26/40 | (2014.01) | |
| B23K 26/362 | (2014.01) | |
| C25D 3/12 | (2006.01) | |
| C25D 5/40 | (2006.01) | |
| C25D 5/48 | (2006.01) | |
| C25D 7/04 | (2006.01) | |
| C23C 14/16 | (2006.01) | |
| C23C 14/02 | (2006.01) | |
| C23C 14/22 | (2006.01) | |
| C23C 4/08 | (2016.01) | |
| C23C 4/129 | (2016.01) | |
| C23C 4/134 | (2016.01) | |
| B23P 15/02 | (2006.01) | |
| C23C 24/04 | (2006.01) | |
| C23C 16/44 | (2006.01) | |
| B32B 5/18 | (2006.01) | |
| B32B 5/20 | (2006.01) | |
| B32B 15/01 | (2006.01) | |
| F01D 25/00 | (2006.01) | |
| C23F 1/04 | (2006.01) | |
| B22F 7/00 | (2006.01) | |
| C22C 1/08 | (2006.01) | |
| B23K 103/02 | (2006.01) | |
| B23K 103/08 | (2006.01) | |

(52) U.S. Cl.
CPC ................ *C25D 3/12* (2013.01); *C25D 5/40* (2013.01); *C25D 5/48* (2013.01); *C25D 7/04* (2013.01); *F01D 25/005* (2013.01); *B22F 7/002* (2013.01); *B22F 2998/00* (2013.01); *B22F 2998/10* (2013.01); *B22F 2999/00* (2013.01); *B23K 2103/02* (2018.08); *B23K 2103/08* (2018.08); *B32B 2305/022* (2013.01); *C22C 1/08* (2013.01); *F05D 2300/612* (2013.01); *Y02P 10/295* (2015.11)

(56) References Cited

U.S. PATENT DOCUMENTS

| | | | |
|---|---|---|---|
| 3,834,881 | A | 9/1974 | Niebylski |
| 4,042,746 | A | 8/1977 | Hofer |
| 5,112,663 | A | 5/1992 | Morenz et al. |
| 5,550,338 | A | 8/1996 | Hielscher |
| 5,594,216 | A | 1/1997 | Yasukawa et al. |
| 6,254,151 | B1 | 7/2001 | Lamparter |
| 6,436,480 | B1 | 8/2002 | Upadhya |
| 7,905,275 | B2 | 3/2011 | Behrens et al. |
| 8,887,864 | B2 | 11/2014 | Sugimoto et al. |
| 2002/0104405 | A1 | 8/2002 | Haack et al. |
| 2002/0121157 | A1 | 9/2002 | Knott et al. |
| 2003/0181303 | A1 | 9/2003 | Leinonen et al. |
| 2004/0226702 | A1 | 11/2004 | Toonen et al. |
| 2005/0208361 | A1 | 9/2005 | Enjoji et al. |
| 2006/0060421 | A1 | 3/2006 | Sarin et al. |
| 2006/0285975 | A1 | 12/2006 | Landis |
| 2007/0003806 | A1 | 1/2007 | Sarkar et al. |
| 2007/0079507 | A1 | 4/2007 | Cheng et al. |
| 2009/0035598 | A1 | 2/2009 | Hanna et al. |
| 2009/0274924 | A1 | 11/2009 | Pelzer et al. |
| 2009/0308571 | A1 | 12/2009 | Thompson et al. |
| 2010/0313580 | A1 | 12/2010 | Morioka et al. |
| 2010/0331173 | A1 | 12/2010 | Ebener et al. |
| 2011/0065022 | A1 | 3/2011 | Min et al. |
| 2011/0297269 | A1 | 12/2011 | Pilon et al. |
| 2012/0152454 | A1 | 6/2012 | Mass et al. |
| 2012/0167572 | A1 | 7/2012 | Rice et al. |
| 2014/0007983 | A1 | 1/2014 | Prest et al. |
| 2014/0021645 | A1 | 1/2014 | Rayess et al. |
| 2014/0103613 | A1 | 4/2014 | Gomez |
| 2014/0169943 | A1 | 6/2014 | Bunker et al. |
| 2015/0118441 | A1 | 4/2015 | Shang et al. |
| 2015/0292818 | A1 | 10/2015 | Wilding et al. |
| 2015/0323263 | A1 | 11/2015 | Yanachi et al. |

FOREIGN PATENT DOCUMENTS

| | | |
|---|---|---|
| DE | 102005004695 | 9/2006 |
| DE | 102011078674 A1 | 1/2013 |
| EP | 0486427 A1 | 5/1992 |
| EP | 1477578 A1 | 11/2004 |
| EP | 2019774 A1 | 2/2009 |
| EP | 2716868 A2 | 4/2014 |
| EP | 2811249 A1 | 12/2014 |
| EP | 2921649 A1 | 9/2015 |
| EP | 2977556 A1 | 1/2016 |
| JP | 2004360630 A | 12/2004 |
| RU | 2592871 C1 | 7/2006 |
| WO | 9833621 A1 | 8/1998 |
| WO | 2007073592 A1 | 7/2007 |
| WO | 2007134626 A1 | 11/2007 |
| WO | 2011010874 A2 | 1/2011 |

OTHER PUBLICATIONS

European Search Report for Application No. EP 17 16 6353.
No Author et al: "Stabilitat vereint Leichtigkeit AFS-Einstoff-Aluminium-Sandwich Metal Foam: Weltweit Einzigartig Stabilitat vereint Leichtigkeit AFS-Einstoff-Aluminium-Sandwich", Mar. 4, 2016.
Partial EP Search Report for EP Application No. EP 17 16 6353.
Davies G. J. et al.: "Metallic Foam: Their Production, Properties and Applications", Journal of Materials Science, Kluwer Academic Publishers, vol. 18, No. 7, 1983.
European Search Report Application No. EP 17 16 6368.
European Search Report for Application No. EP 17 16 6349.
European Search Report for Application No. EP 17 16 6366.
European Search Report for Application No. EP 17 16 6371.
European Search Report for Application No. EP 17 16 6376.
EP Office Action dated Jul. 30, 2018 for Application No. 17 166 220.8.
EP Office Action dated Sep. 6, 2018 for Application No. 17 166 353.7.
JP 2004-360630 Machine Translation, 13 pages.
RU 2,592, 871 Machine Translation, 5 pages; dated Jul. 27, 2016.

* cited by examiner

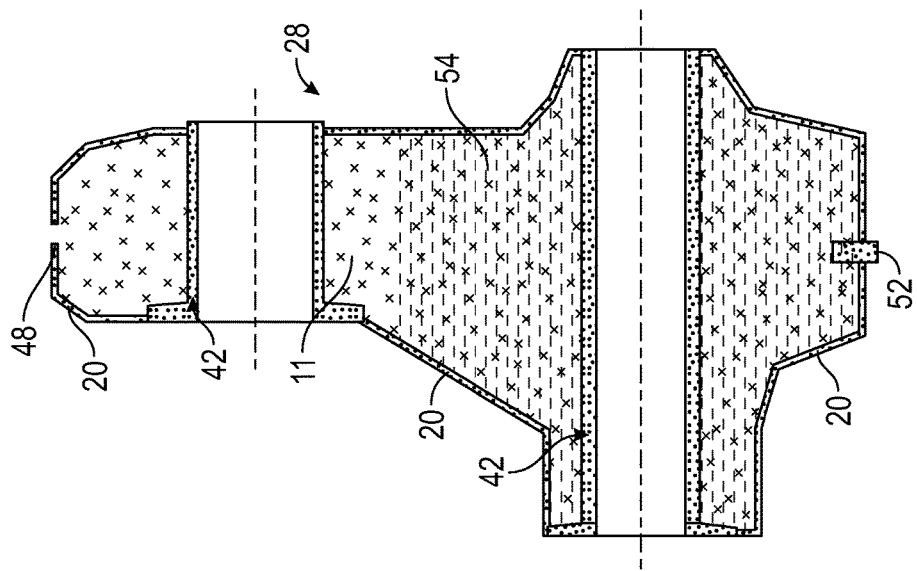
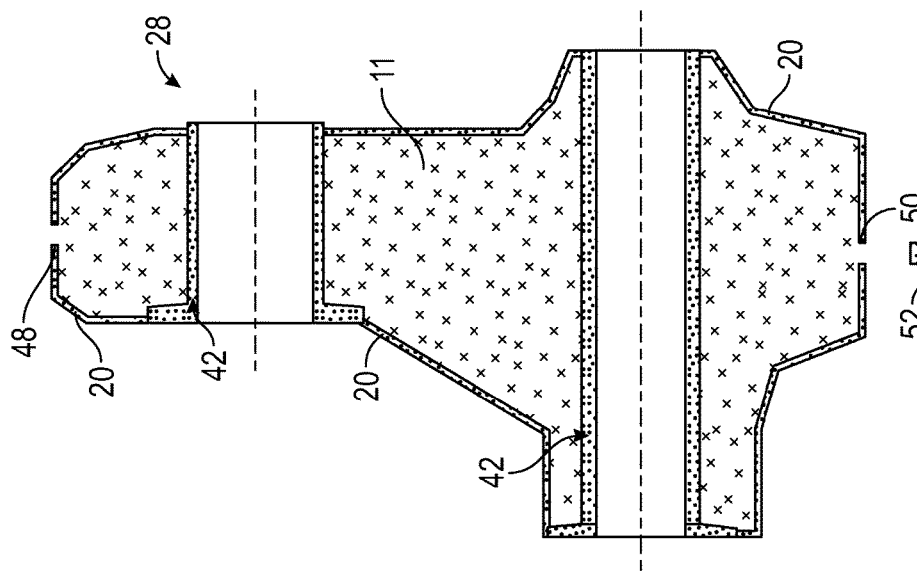

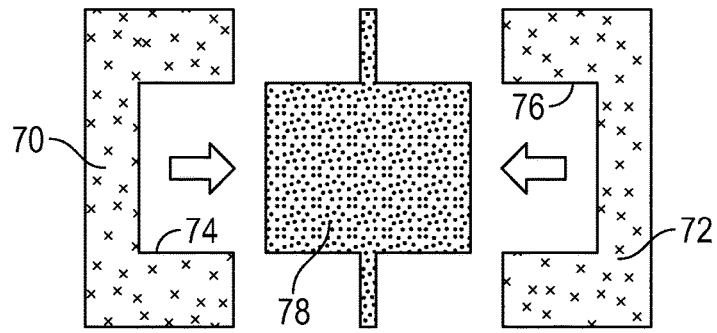
FIG. 19
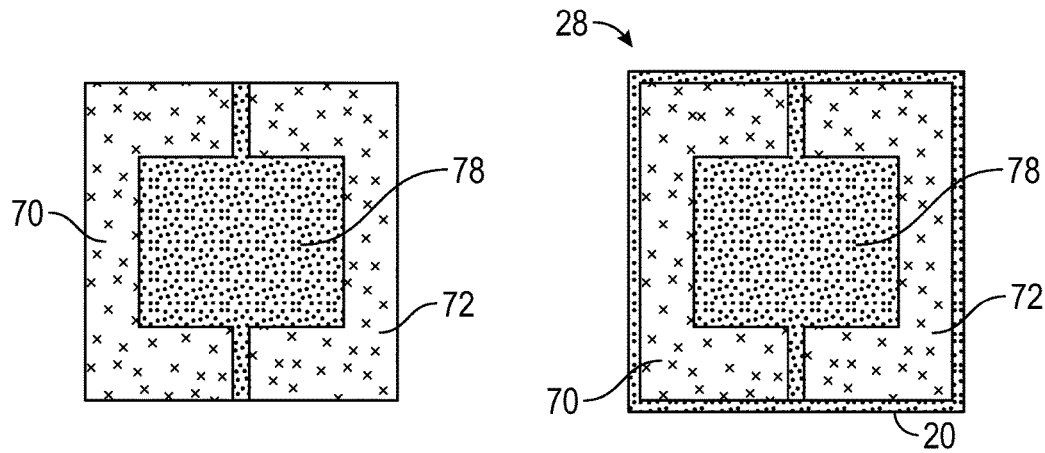
FIG. 20
FIG. 21
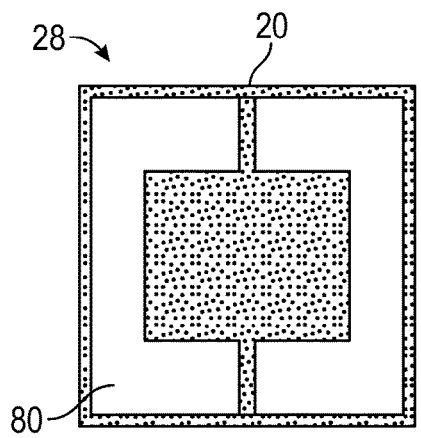
FIG. 22

LIGHT WEIGHT HOUSING FOR INTERNAL COMPONENT AND METHOD OF MAKING

BACKGROUND

This disclosure relates generally to methods of making low cost, light weight components and components formed by the aforementioned methods. In particular, the present application is directed to a component formed from a composite of metallic foam and an external metallic shell. In addition, various embodiments of the present disclosure are also directed to methods for making such a component.

Commercially suitable components need to meet specific performance criteria. However, while a component may meet certain performance criteria it may be at the cost of other desirable factors such as component weight, time to manufacture and cost to manufacture. For example, subtractive manufacturing or machining oversized blocks, materials or forgings until a desired final part shape is achieved may be one process. However, and in this process, the monolithic nature of the raw input material means that the final part weight is driven by the final volume of the part and density of material used.

Accordingly, it is desirable to provide low cost, light weight components and components formed by such methods.

BRIEF DESCRIPTION

In one embodiment, a method of making a light weight component is provided. The method including the steps of: forming a metallic foam core into a desired configuration; inserting a pre-machined component into an opening in the metallic foam core; applying an external metallic shell to an exterior surface of the metallic foam core after it has been formed into the desired configuration and after the pre-machined component has been inserted into the metallic foam core; introducing an acid into an internal cavity defined by the external metallic shell; dissolving the metallic foam core; and removing the dissolved metallic foam core from the internal cavity, wherein the component and the external metallic shell are resistant to the acid.

In addition to one or more of the features described above, or as an alternative to any of the foregoing embodiments, the metal of the metallic foam core is formed from nickel and the external shell is Inconel and the acid is a nitric acid.

In addition to one or more of the features described above, or as an alternative to any of the foregoing embodiments, the metallic foam core is an open cell structure.

In addition to one or more of the features described above, or as an alternative to any of the foregoing embodiments, the metallic foam core is a closed cell structure.

In addition to one or more of the features described above, or as an alternative to any of the foregoing embodiments, the metallic foam core is formed into the desired configuration by a machining process selected from the group comprising: milling; grinding; electrical discharge machining (EDM); water-jet machining; and laser machining; and wherein the desired configuration is slightly smaller than the final dimensions of the light weight component.

In addition to one or more of the features described above, or as an alternative to any of the foregoing embodiments, the metallic foam core is a sheet of metallic foam and the sheet of metallic foam is formed into the desired configuration by a hot or cold forming process wherein the sheet of metallic foam is placed in a die.

In addition to one or more of the features described above, or as an alternative to any of the foregoing embodiments, the metallic foam core is formed into the desired configuration by a machining process selected from the group comprising: milling; grinding; electrical discharge machining (EDM); water-jet machining; and laser machining after the hot or cold forming process.

In addition to one or more of the features described above, or as an alternative to any of the foregoing embodiments, the external metallic shell is deposited on the exterior surface of the metallic foam core via an application process selected from the group comprising: flame spray application process; plasma spray application process; cold-spray application process; electron beam physical vapor deposition (EB/PVD); chemical vapor deposition (CVD); electroplating application process, and wherein the external metallic shell is deposited about the entire exterior surface of the metallic foam core.

In addition to one or more of the features described above, or as an alternative to any of the foregoing embodiments, wherein an interim coat is deposited on the exterior surface of the metallic foam core prior to the application of the external metallic shell.

In addition to one or more of the features described above, or as an alternative to any of the foregoing embodiments, wherein the interim coat is a ceramic based thermal barrier coating.

In addition to one or more of the features described above, or as an alternative to any of the foregoing embodiments, further including the step of: heat treating the metallic foam core after the external metallic shell has been applied to the exterior surface of the metallic foam core.

In addition to one or more of the features described above, or as an alternative to any of the foregoing embodiments, further including the step of: forming additional features in the metallic foam core after the external metallic shell has been applied to the exterior surface of the metallic foam core.

In addition to one or more of the features described above, or as an alternative to any of the foregoing embodiments, wherein the additional features are formed by a drilling process.

In addition to one or more of the features described above, or as an alternative to any of the foregoing embodiments, wherein a supplemental application of the external metallic outer shell is applied to the metallic foam core after the drilling process.

In addition to one or more of the features described above, or as an alternative to any of the foregoing embodiments, wherein a thickness of the external metallic outer shell varies in order to provide localized structural rigidity to the component.

In addition to one or more of the features described above, or as an alternative to any of the foregoing embodiments, wherein the pre-machined component is a conduit.

In yet another embodiment, a component formed by anyone of the aforementioned methods is provided.

In yet another embodiment, a method of making a light weight component is provided. The method including the steps of: forming a plurality of metallic foam core segments; applying a metallic shell to a discrete surface of at least one of the plurality of metallic foam core segments; assembling the plurality of metallic foam core segments into a desired configuration; applying an external metallic shell to an exterior surface of the metallic foam core segments after they have been placed into the desired configuration; introducing an acid into an internal cavity defined by the external metallic shell; dissolving the metallic foam core; and removing the dissolved metallic foam core from the internal cavity, wherein the metallic shell and the external metallic shell are resistant to the acid.

In addition to one or more of the features described above, or as an alternative to any of the foregoing embodiments, wherein the metallic shell is surrounded by the external metallic shell.

In yet another embodiment, a component is provided. The component having: an external metallic shell defining an internal cavity; a pre-machined component located in the internal cavity, wherein the internal cavity is formed by applying the external metallic shell to an exterior surface of a metallic foam core and dissolving the metallic foam core after the external metallic shell has been applied to the exterior surface of the metallic foam core.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIGS. 11-22 illustrate an alternative embodiment of the present disclosure;

DETAILED DESCRIPTION

Various embodiments of the present disclosure are related to methods of making low cost, light weight components and components formed by the aforementioned methods. In particular, the present application is directed to a component having an internal foam core, which in one embodiment may be a metallic foam core or alternatively a non-metallic foam core such as a ceramic foam core or any other non-metallic foam core and an external metallic shell surrounding the metallic or non-metallic foam core and methods for making such a component.

The present disclosure is directed to a method of making a component using a combination of subtractive and additive manufacturing processes. In general, the method starts with a metallic foam core using alloy and foam density that is compatible with a specific design application. As mentioned above and in alternative embodiments, the foam core may be non-metallic. The metallic foam core is then machined or formed to a shaped pre-form for subsequent manufacturing steps. After the metallic foam core is formed to the desired shape, a metallic skin is applied to the external surface of the metallic foam core creating a light-weight, rigid structure which can have characteristics similar to existing non-metallic foam core or metallic or non-metallic honeycomb components. After the metallic skin is applied a final machining of the component may occur wherein dimensional characteristics and/or features are added to the component.

Figure 1:
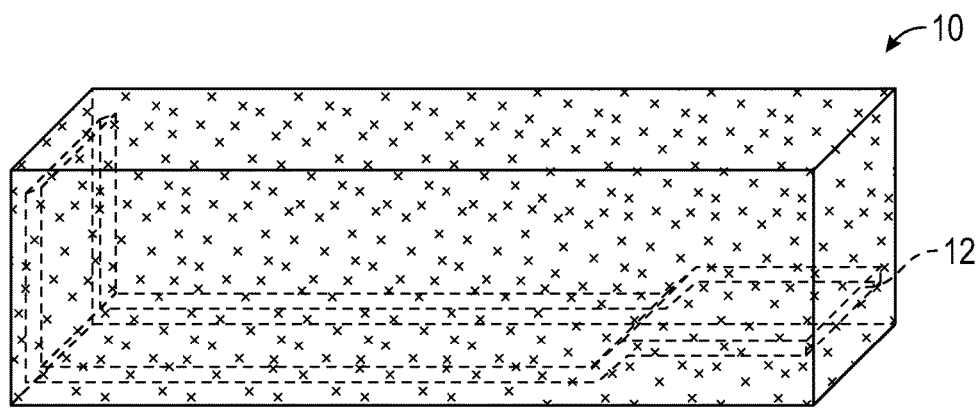
FIG. 1 is a perspective view of an un-machined block of metallic foam.

Referring now to FIG. 1, an unformed block of metallic foam 10 is illustrated. The block of metallic foam 10 may be formed from any suitable metal either commercially pure or alloy including but not limited to anyone of the following: titanium (including Ti 6-4, Ti 6-2-4-2, beta phase alloys including Beta 21s), cobalt, aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. In general, a metallic foam may be referred to as a cellular structure comprising a solid metal with a large volume fraction of pores. These pores may be sealed (closed-cell foam) or interconnected (open-cell foam). In one non-limiting embodiment, the porosity of the foam may be within the range of 5% to 80%. Of course, ranges of porosity greater or less than the aforementioned range are considered to be with the scope of various embodiments of the present disclosure. Selection of the porosity of the metallic foam may be dependent upon the ultimate end use of the component to be formed. For example and in some applications, it may be desirable to have a more porous foam core or a less porous foam core. The metallic foam block 10 is large enough to contain a desired part or component geometry 12 illustrated by the dashed lines 12 in FIG. 1.

Figure 2:
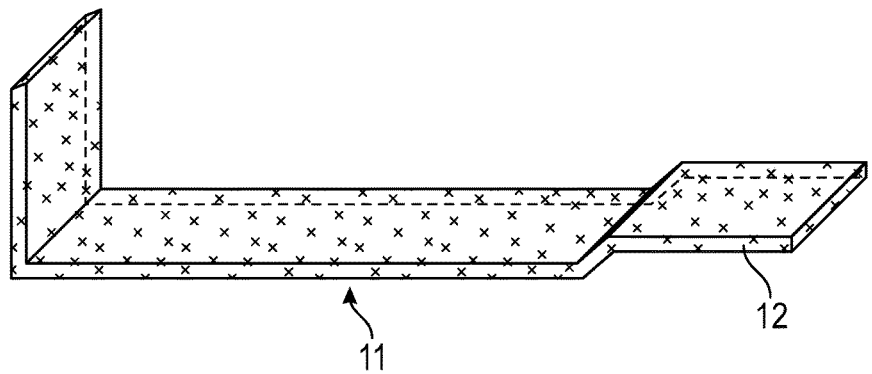
FIG. 2 is a perspective view of a machined block of metallic foam.

In FIG. 2, the block of metallic foam 10 has been machined into a foam core 11 having the desired interim part or interim component geometry 12 via any suitable process. As used herein interim part or interim component geometry may be referred to as being slightly smaller than the final part or component geometry in order to account for the applied external metallic shell 20. In some applications, it may be desirable to form the metallic foam core to near net shape as part of the initial foam manufacturing process. Examples of machining processes include but are not limited to milling, grinding, electrical discharge machining (EDM), water-jet machining, laser machining, combinations thereof or any other process capable of machining the block 10 into the metallic foam core 11 having the component geometry 12. In alternative embodiments, the die 16 may have more than one pair of elements or die halves 18.

Figure 3:
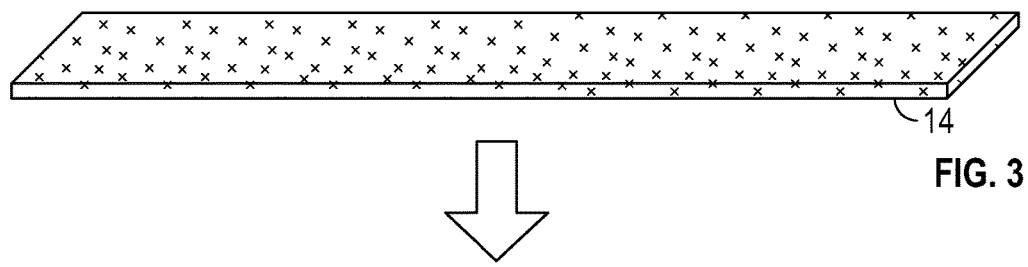
FIG. 3 is a perspective view of an un-formed sheet of metallic foam.
Figure 3A:
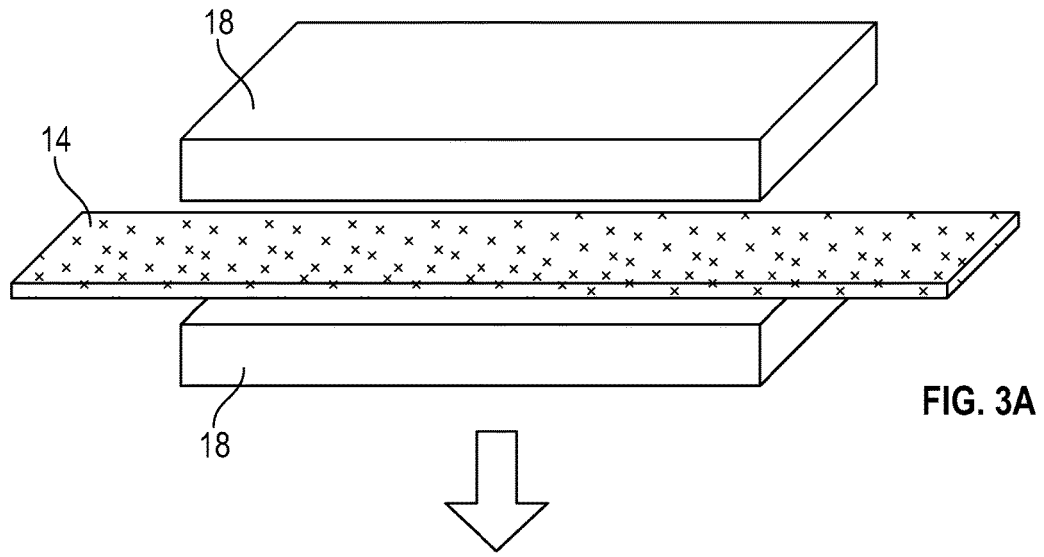
FIG. 3A is a perspective view of the un-formed sheet of metallic foam placed in a die for forming the un-formed sheet of metallic foam.
Figure 4:
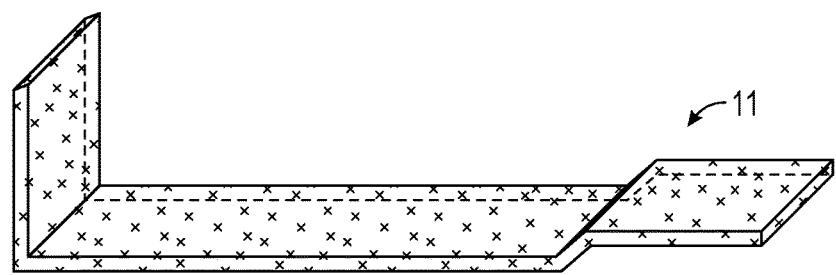
FIG. 4 is a perspective view of a formed sheet of metallic foam.

Alternatively and as illustrated in FIGS. 3, 3A and 4, a sheet of metallic foam 14 may be provided. In this alternative process, the sheet of metallic foam 14 is formed into the foam core 11 having the desired part or component geometry 12 via a hot or cold forming process wherein the sheet of metallic foam 14 is placed in a die 16. The die 16 may include a pair of complementary halves 18 configured to form the desired part or component geometry 12.

The formed component or metallic core 11 is illustrated in FIG. 4. The formed sheet of metallic foam may be further shaped to a final configuration using the aforementioned machining processes such as milling, grinding, electrical discharge machining (EDM), water-jet machining, laser machining, combinations thereof or any other process capable of machining the formed sheet of metallic foam.

Figure 5:
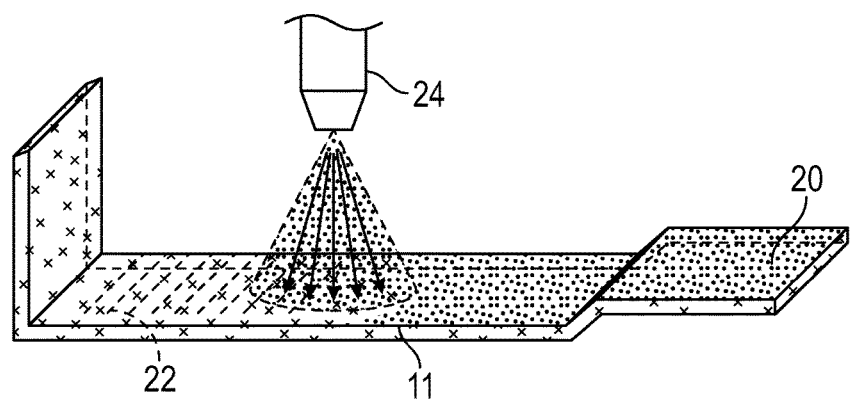
FIG. 5 illustrates the application of an external metallic shell to the formed or machined metallic foam of FIG. 2 or 4.

Referring now to at least FIG. 5, the formed metallic foam core 11 from any of the aforementioned processes (machining, forming or combinations thereof) depicted in at least FIGS. 1-4, has an external metallic shell 20 deposited on the exterior surface of the formed metallic foam core 11. In one embodiment, the external metallic shell 20 is deposited about the entire exterior surface of the formed metallic foam core 11. Alternatively, discrete areas of the formed metallic foam core may be masked such that the external metallic shell 20 is prohibited from covering certain areas. The external metallic shell 20 may also be referred to as an outer reinforcing metallic skin 20. Accordingly, the metallic foam pre-form or core 11 is used as a base for application of the external metallic shell 20. Depending on the initial foam cell size and material being deposited as well as the deposition method, it may be permissible to have an interim coat or applique to form a non-porous intermediate layer for metallic deposition. In this embodiment, the interim coat is first applied and then the external metallic shell 20 is applied to the metallic foam pre-form or core 11. In FIG. 5, the interim coat is illustrated by the dashed lines 22. The external metallic shell 20 is a metallic material chemically and metallurgically compatible with that of the metallic foam and the external metallic outer shell 20 may be applied via any suitable methods including but not limited to the following application processes: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means. In one embodiment, the deposited external metallic shell 20 is Inconel 718. The external metallic outer skin can be made of any of the same alloys listed in the core section which includes but is not limited to titanium (including Ti 6-4, Ti 6-2-4-2, beta phase alloys including Beta 21s), cobalt, aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. The material used in the external metallic outer skin may be the same or may be different than that used in the foam core depending on the metallurgical compatibility of the outer skin to the foam core. In addition and in some instances when a different alloys is used for the external skin 20 as opposed to that used for the foam core, one or more intermediate alloys may be used as interim coat or coats 22 covering portions or all of the part to bridge the compatibility of the core alloy 11 and the outermost skin alloy 20.

Other non-metallic materials may be deposited in place of or in addition to the metallic coatings, these coatings may include ceramic based thermal barrier coatings.

Figure 6:
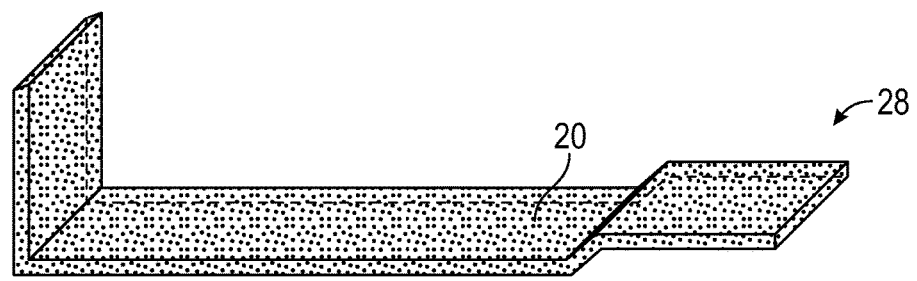
FIG. 6 illustrates the formed or machined metallic foam of FIG. 2 or 4 with an applied external metallic shell.

In FIG. 5, a nozzle 24 is illustrated and in one embodiment, the nozzle 24 may be used in conjunction with a plasma spray application process. Once the external metallic outer shell 20 is applied to the exterior surface of the metallic foam pre-form or core 11, this part, as illustrated in FIG. 6, is inspected for surface coverage and may be further subjected to a heat treating step in order to relieve residuals stresses imparted by manufacturing and outer skin deposition processes and/or to provide desired final material properties. In applications where the foam core is an open cell structure, the outer skin may be perforated with a plurality of venting holes to allow for internal air to escape from the part as it is heated during the heat treating step. In one embodiment, the venting holes may be sealed after the heat treating step and in other embodiments, the venting holes may be subsequently sealed after the heat treating step.

Figure 7:
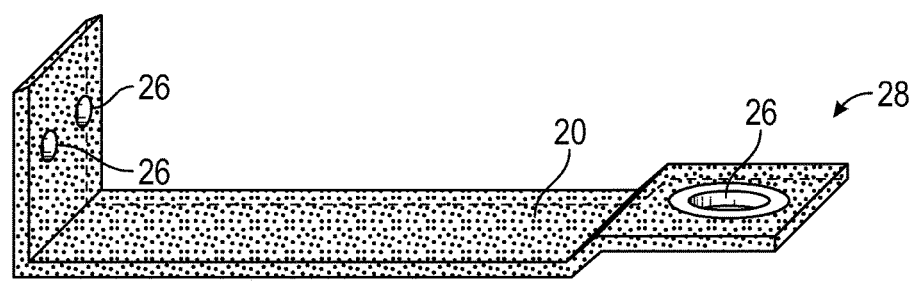
FIG. 7 illustrates the formed or machined metallic foam of FIG. 6 with additional features formed therein.

At the next step, additional features 26 are introduced to the coated metallic foam pre-form or core 11 in order to form the desired part or component 28. These additional features may be added by any suitable process such as milling, spot-face drilling, counter-bore drilling, conventional drilling, etc. In FIG. 7, the features 26 are illustrated as openings, of course, any other configurations are considered to be within the scope of various embodiments of the present disclosure. Still further and in the event that the drilling process removes some of the external metallic outer shell 20 and the metallic foam is exposed, a supplemental application process of the external metallic outer shell 20 may be employed to cover the exposed metallic foam. In yet another embodiment, the part 28 may not require any additional features 26 to be added. In one non-limiting embodiment, the component 28 may comprise the formed metallic core 11, an applied external metallic shell 20 and if applicable feature 26 as well as an intermediary layer 22 located between an external surface of the formed metallic core 11 and the applied external metallic shell 20.

Since the external metallic outer shell 20 is applied via a process wherein the localized thickness of the external metallic outer shell 20 may vary with respect to other locations, the thickness of the external metallic outer shell 20 on the exterior of the part may be tailored in thickness, pattern and orientation to provide preferential strength and thus the part or component 28 may have localized structural features such as ribs or gussets, which are provided by the applied external metallic outer shell 20.

Figure 8:
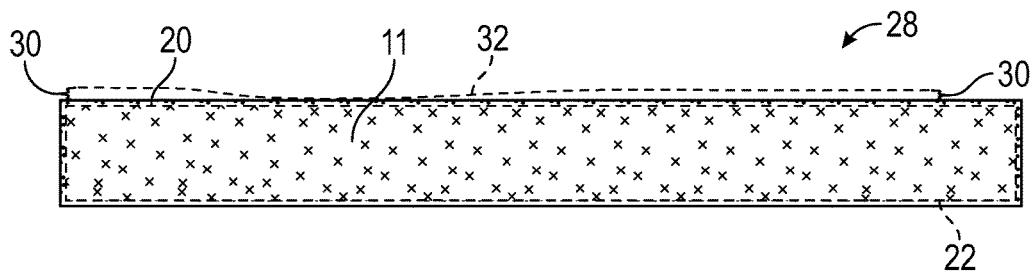
FIG. 8 is a cross-sectional view of a portion of the formed or machined metallic foam of FIG. 6 or 7.
Figure 8A:
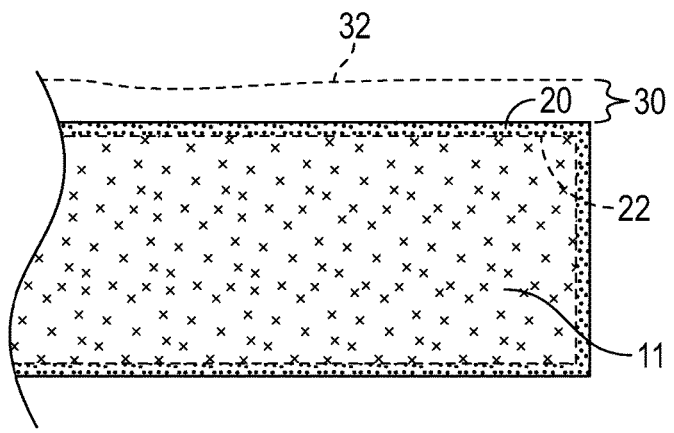
FIG. 8A is an enlarged cross-sectional view of a portion of the formed or machined metallic foam of FIG. 6 or 7.

For example and referring at least to the cross-sectional view of FIGS. 8 and 8A, a thickness 30 of the external metallic outer shell 20 may vary. In FIG. 8, the dashed line 32 is provided to illustrate the varying thickness of the external metallic outer shell 20 that surrounds the internal metallic foam core 11. Also shown in FIGS. 8 and 8A is the intermediary layer 22, which may or may not be applied prior to the application of the external metallic outer shell 20.

In yet another implementation and for parts designed to be capable of bending in certain areas over others, the applied metallic skin on the external surface of the formed part in some applications places the load carrying material away from a neutral axis of the part for high structural efficiency.

In accordance with various embodiments of the present disclosure, machining or forming of the metallic foam core 11 can be done very quickly and at lower expense than machining a solid block of material. This will result in a significant reduction in raw material waste vs. machining processes applied to solid blocks of material. In addition, the metallic deposition on the outside of foam core may be tailored in thickness to provide preferential strength.

Figures 9, 10:
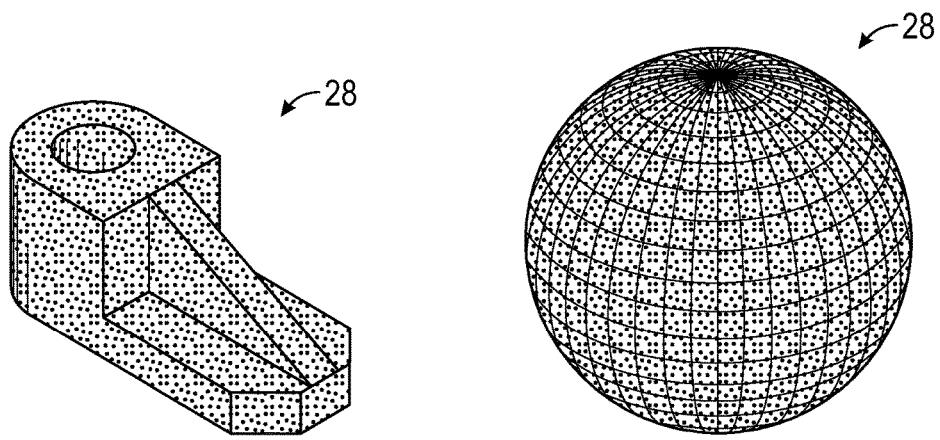
FIGS. 9 and 10 are non-limiting examples of components formed by the methods of the present disclosure.
Figure 12:
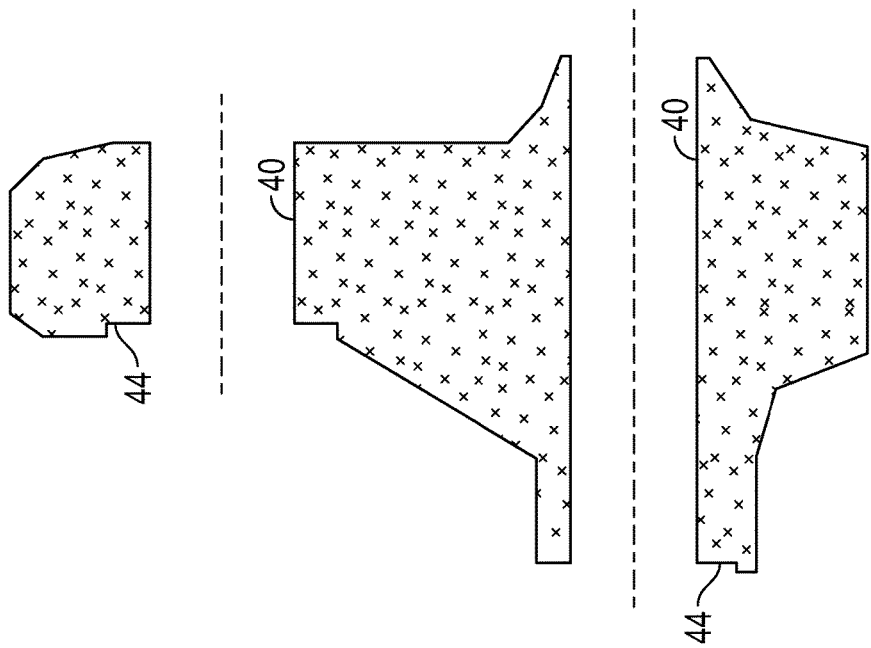

FIGS. 9 and 10 illustrate non-limiting examples of a part or component 28 formed by the various methods of the present disclosure. Some additional non-limiting examples of contemplated components or parts include brackets, housings, ducts, liner assemblies, (commercial engine tail cones, nozzles, etc.). In one non-limiting embodiment, the part or component 28 may be an aviation component. In another embodiment, the component may be used in any application where the component weight and cost are key design constraints.

Referring now to FIGS. 11-22, another embodiment of the present disclosure is illustrated. In this embodiment the known chemical characteristics of select alloys used in the creation of metallic foam as well as the characteristics of alloys that may be deposited as external metallic shell 20 are used in order to provide a component 28 that has an outer metallic shell 20 that is resistant to an acid wash used to remove the metallic foam core 11. Accordingly, a leaching acid dissolve is used for one material while having no impact on the other materials due to the unique chemical composition (alloy content) of the metallic foam core 11 versus the metallic shell. While there are multiple material combinations, the following example provides one option for implementation: a metallic foam fabricated from commercially pure nickel, and an outer metallic skin consisting of deposited Inconel 718 via electron beam melt, cold spray or other means, and removal of the commercially pure nickel foam metallic core using concentrated nitric acid (HNO3). This process completely dissolves the foam core leaving the deposited Inconel 718 in place. In comparison to existing casting processes used to produce a comparable part configuration, the proposed embodiment offers improved control over wall thickness of outer shell 20. Current casting technology limits minimum wall thickness to approximately 0.060 inch to account for reduced wall thickness in areas where the core die can shift relative to the outer shell. Because deposition of the outer shell 20 can be controlled via known computer control techniques over a precise foam core 11, the resulting wall thickness can be tailored resulting in the potential for a more weight optimized structure with local wall thickness as low as 0.005 inch and possibilities to go even lower.

Figure 11:
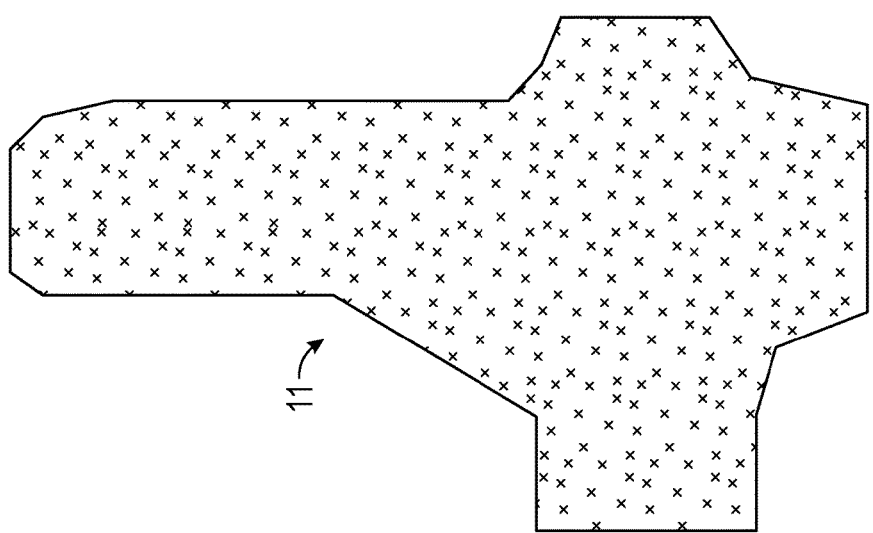
Figure 14:
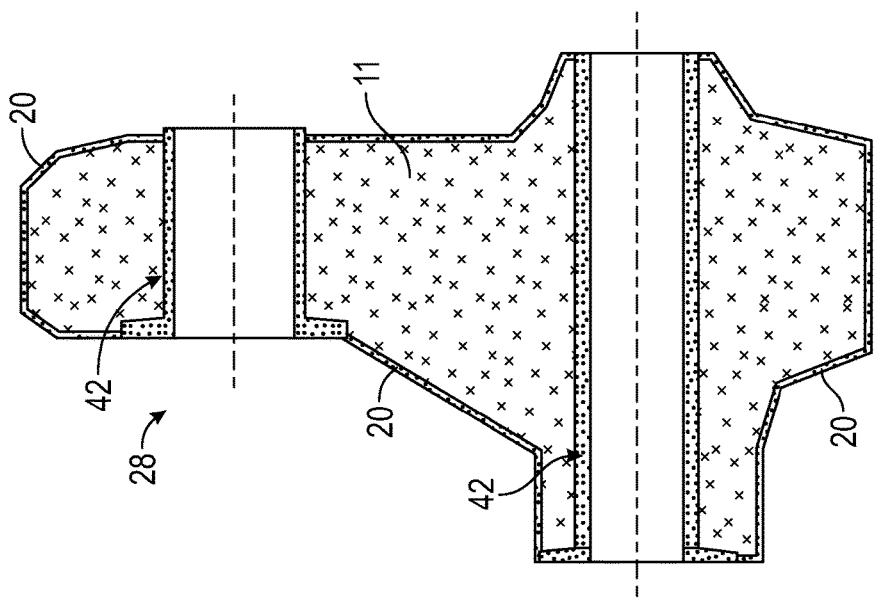
Figure 13:
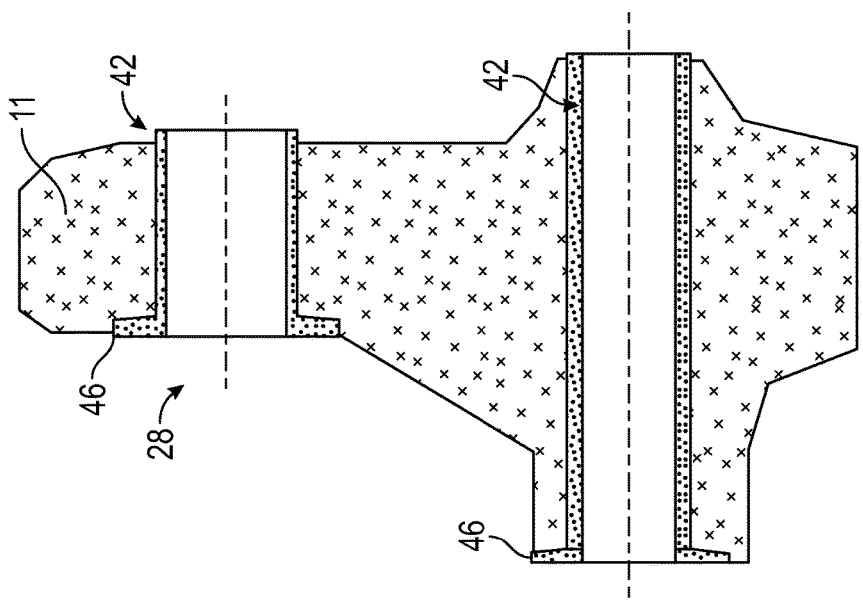

Referring now to FIG. 11, a metallic foam core 11 is formed via the aforementioned processes. Then using the same aforementioned machining processes, the foam core 11 is further machined to include features or openings 40 in the metallic foam core 11. These features or openings 40 are configured to allow pre-machined components or additional features 42 to be inserted into the features or openings 40 of the foam core 11 prior to the application of the external metallic shell 20. FIG. 13 illustrates a pair of components 42 inserted into openings or features 40. In one non-limiting example, the pre-machined components or additional features 42 may be conduits and the features or openings 40 may be configured to have a counter sink feature 44 configured to receive a flange 46 of the conduits 42.

Once the pre-machined components or additional features 42 are inserted into the openings 40 of the metallic foam core 11, the external metallic shell 20 is applied to an exterior of the metallic foam core 11 using any of the aforementioned application processes. Accordingly, the pre-machined components 42 and the metallic foam core 11 are encapsulated by the metallic external shell 20. This is illustrated in at least FIG. 14.

Referring now to FIG. 15 and once external metallic shell 20 has been applied to the metallic foam core 11, an inlet opening 48 and an outlet opening 50 are formed in the external metallic shell 20. This allows for the introduction of an acid into the internal cavity of the component 28, which as will be discussed herein is used to dissolve and subsequently remove the metallic foam core 11 from the interior of the component 28. Prior to the application of the acid a temporary plug 52 is inserted into outlet opening 50. As illustrated in FIG. 16, an acid 54 is introduced into the internal cavity of the component 28 via inlet opening 48.

Figure 17:
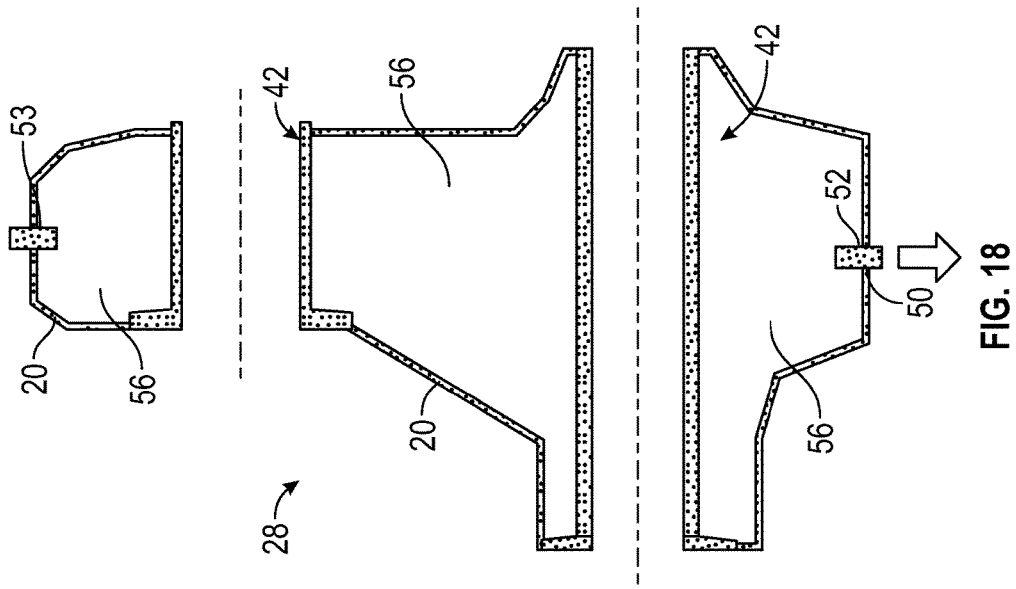

FIG. 17 illustrates the entire internal cavity of the component 28 being filled with an acid 54. As discussed above, acid 54 is configured to dissolve the metallic foam core 11 while leaving the internal components 42 and the exterior metallic shell 20 intact. In one non-limiting embodiment, the metallic foam 11 is fabricated from commercially pure nickel, and the outer metallic skin consists of Inconel 718 and the acid 34 a concentrated nitric acid (HNO3). Also, the internal components 42 may be solid Inconel 718 or have at least an outer covering of Inconel 718 to protect the component form the HNO3 acid ] such that they also remain in place after the acid 34 is removed from the internal cavity of the component 28. Note that the selection of Inconel 718 alloy for shell 20 and internal components 42 is a specific embodiment and is known to resist the HNO3 acid used to dissolve the commercially pure nickel foam core 11. Other alloy and acid combinations form the basis for optional embodiments. Once entire internal cavity of the component 28 is filled with the acid 54 the component 28 is allowed to sit for predetermined time until the metallic foam 11 is dissolved.

Figure 18:
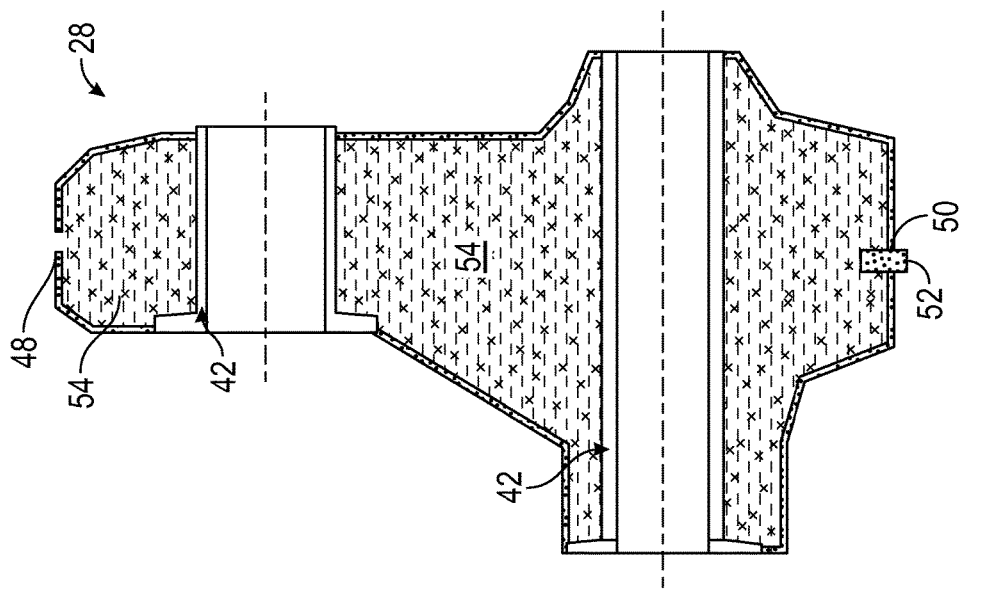

The dissolved metallic foam 11 is removed from the internal cavity of the component 28 by removing temporary plug 52 such that the dissolved metallic foam may exit through outlet opening 50. FIG. 18 shows the component 28 after the metallic from 11 has been dissolved. As illustrated, the only remaining parts are the external metallic shell 20 and to the internal components 42. In addition, the component 28 is now provided with a completely hollow structure or cavities 56 located about the internal components 42 and the external metallic shell 20. If necessary, plug 52 is then permanently inserted into opening 50 and a plug 53 is permanently inserted into opening 48. Also, additional features may be machined into internal components 42 and/or the external shell 20.

FIGS. 19-22 illustrate another implementation of an embodiment of the present disclosure. As illustrated in FIGS. 19-22, a pair of metallic foam cores 70 and 72 are formed via any of the offer mentioned processes wherein the pair of metallic foam cores 70 and 72 are configured to have recess pockets 74 and 76 configured to encase or surround an internal component 78 as illustrated in FIG. 20. Once the internal component 78 is surrounded by the metallic foam cores 70 and 72 the external metallic outer skin 20 is applied via any of the after mentioned processes. The component 28 with the applied external metallic outer skin 20 is illustrated in at least FIG. 21. Thereafter, the acid 54 for dissolving the metallic foam core 70 and 72 is inserted into the cavity defined by the metallic outer shell 20 of component 28. As mentioned above and once dissolved, the metallic foam cores 70 and 72 are removed from the component and internal cavities 80 are now located within the component 28. In this embodiment, internal component 78 has more structural features than the conduits illustrated in FIGS. 13-18.

Figure 23:
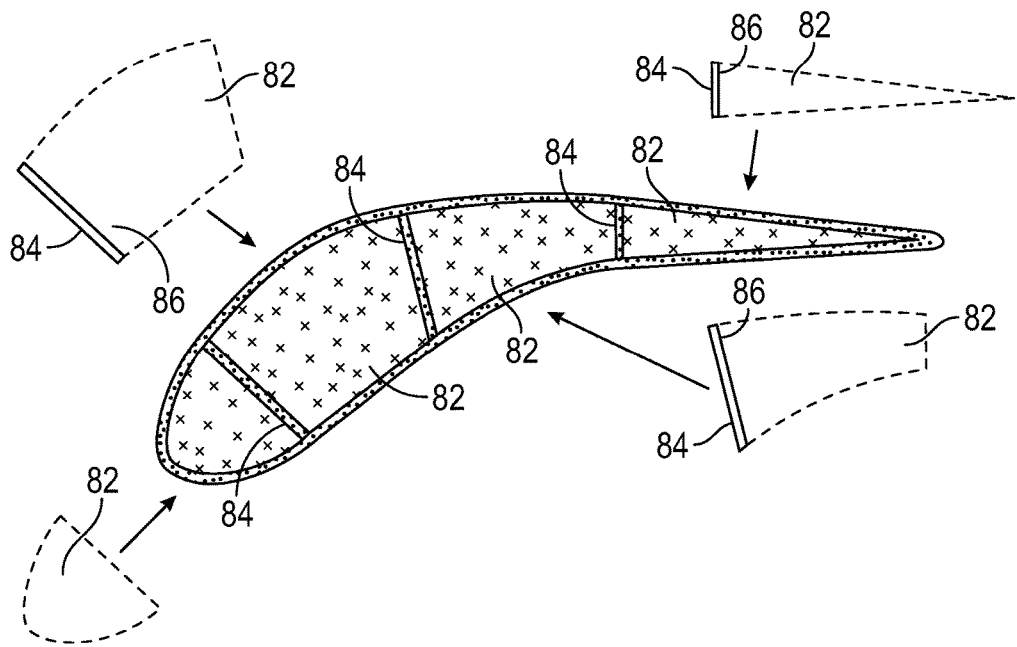
FIG. 23-25 illustrates yet another alternative embodiment of the present disclosure.
Figure 24:
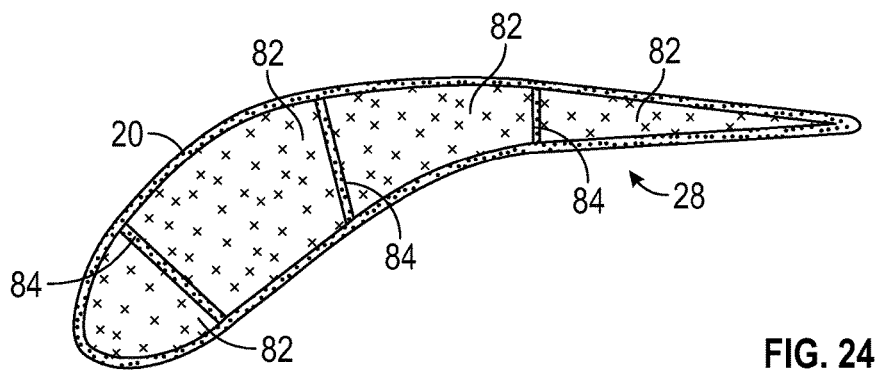
Figure 25:
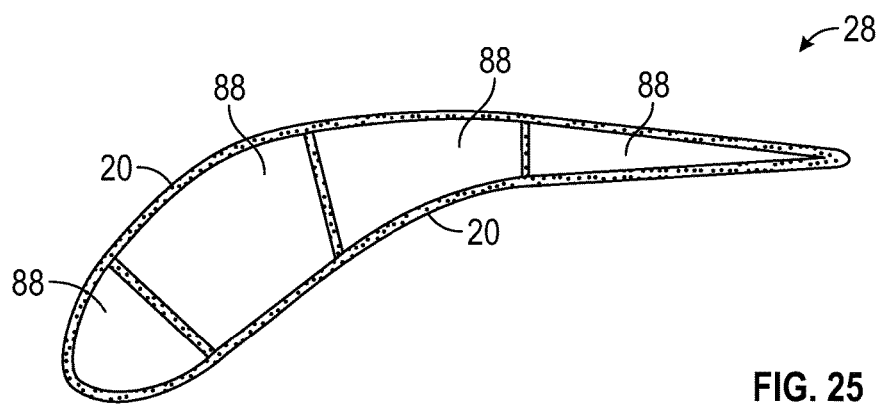

In yet another embodiment and as illustrated in FIGS. 23-25, a component 28 may be formed by a plurality of preformed metallic foam cores 82 some of which may have an external metallic shell 84 applied to a discrete surface 86 or surfaces 86 of the preformed metallic foam cores 82. FIG. 23 illustrates the preformed metallic foam cores 82 in an assembled state and an unassembled state. Thereafter and once the plurality of preformed metallic cores 82 are assembled to define a configuration of the component 28 (FIG. 24) the external metallic shell 20 is applied to the external surfaces of the assembled preformed metallic cores 82. As illustrated in FIG. 24, when assembled, previously applied metallic cells 84 are internally located within component 20. This allows the component 28 to have internal metallic structures illustrated in FIG. 25 when the preformed metallic foam cores 82 are removed using the acid 54 as previously described such that a plurality of discrete internal cavities 88 are now defined within component 28. In accordance with one non-limiting exemplary embodiment, component 28 may be an airfoil used in a gas turbine engine.

The various embodiments disclosed herein allow for complex casting substitutes using a process that does not require long-lead time, expensive casting dies. In addition, process controlled deposition of the outer metallic layer can be done significantly below the current casting minimum wall limits allowing for reduced weight and increased local structural optimization with less material utilization.

Figure 26:
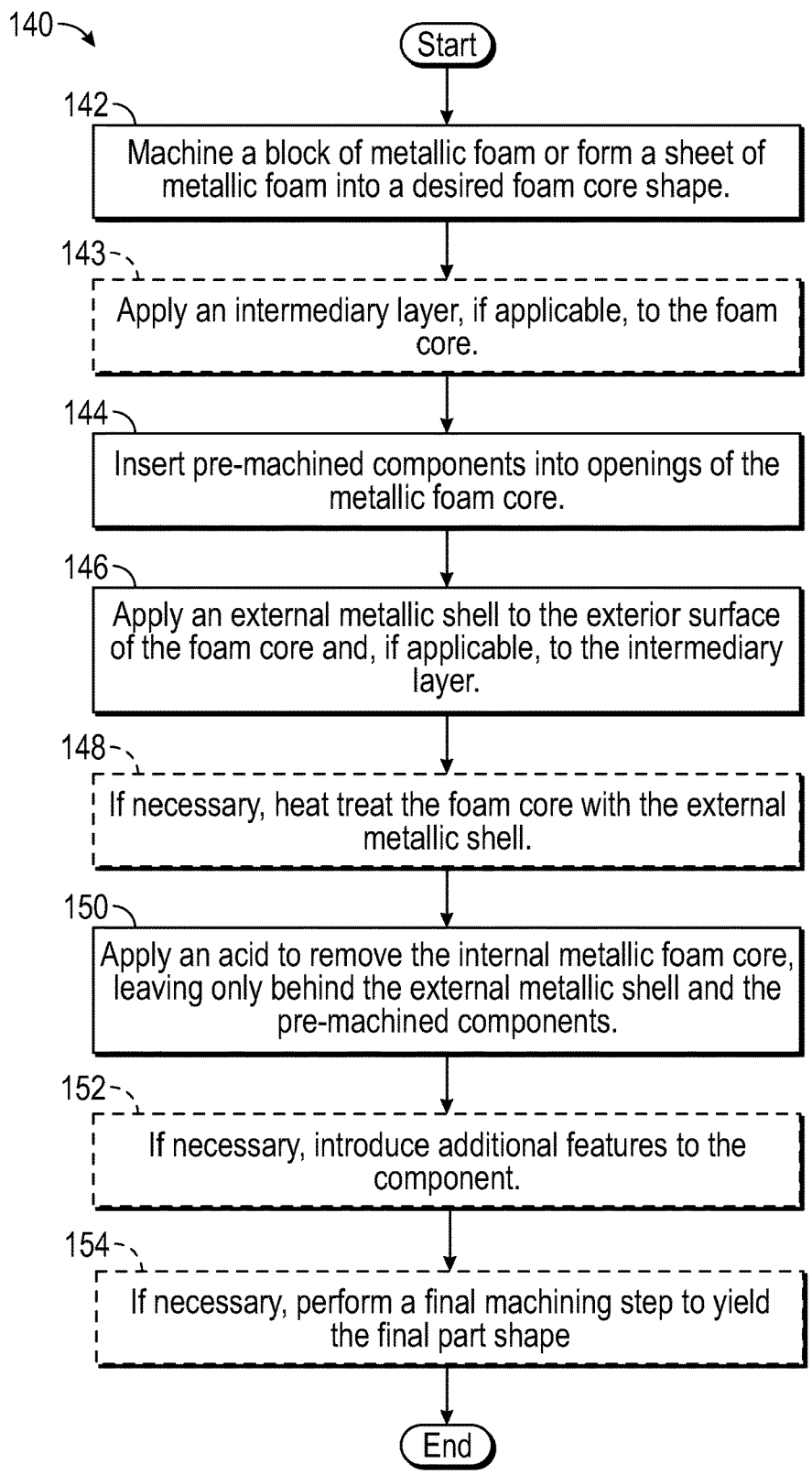
FIG. 26 is a flow chart illustrating a method of making a component according to non-limiting methods of the present disclosure.

Referring now to FIG. 26, a flow chart 140 illustrating a method for forming a part or component 28 in accordance with various embodiments of the present disclosure is illustrated. At a first step 142, an unformed block of metallic foam 10 is machined to foam core 11, which as discussed above will have openings or cavities 40 configured to allow pre-machined components or additional features 42 to be inserted into the features or openings 40 of the foam core 11 prior to the application of the external metallic shell 20. As mentioned above, non-limiting machining processes include milling, grinding, electrical discharge machining (EDM), water-jet machining, laser machining, combinations thereof or any other process capable of machining the block 10 into the metallic foam core 11 having the component geometry 12. Alternatively and at the first step 142, a sheet of metallic foam 14 may be provided and the sheet of metallic foam 14 is formed into the foam core 11 having the desired part or component geometry 12 via a hot or cold forming process wherein the sheet of metallic foam 14 is placed into a die 16. The die 16 may include a pair of complementary halves 18 configured to form the desired part or component geometry 12. The formed sheet of metallic foam may be further shaped to a final configuration including the aforementioned openings 40 using the aforementioned machining processes.

Thereafter and at step 144, the formed component or metallic core 11 from any of the aforementioned processes (machining, forming or combinations thereof) has pre-machined components 42 inserted into the openings 40 of the metallic foam core 11.

Thereafter and at step 146, the formed component or metallic core 11 has an external metallic shell 20 deposited on the exterior surface of the formed metallic foam core 11. As a precursor to step 144, an interim coat or applique may be applied to the foam core 11 prior to the application of the external metallic shell 20. This is illustrated as alternative step 143, which is illustrated in dashed lines. As mentioned above, the external metallic outer shell 20 may be applied via any one of the aforementioned processes including but not limited to: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means.

Once the external metallic outer shell 20 is applied to the exterior surface of the metallic foam pre-form or core 11, this part, may be further subjected to a heat treating step 146, which is illustrated in dashed lines as this step may not be required in all processes.

At step 150, the aforementioned acid 54 is applied and the metallic foam core 11 is dissolved and removed from the component leaving only the external metallic shell 20 and the pre-machined components 42.

At step 152, additional features 26, if required, are introduced to the component 28. These additional features may be added by any suitable process such as milling, spot-face drilling, counter-bore drilling, conventional drilling, etc. In yet another embodiment, the part or component 28 may not require any additional features 26 to be added.

Figure 27:
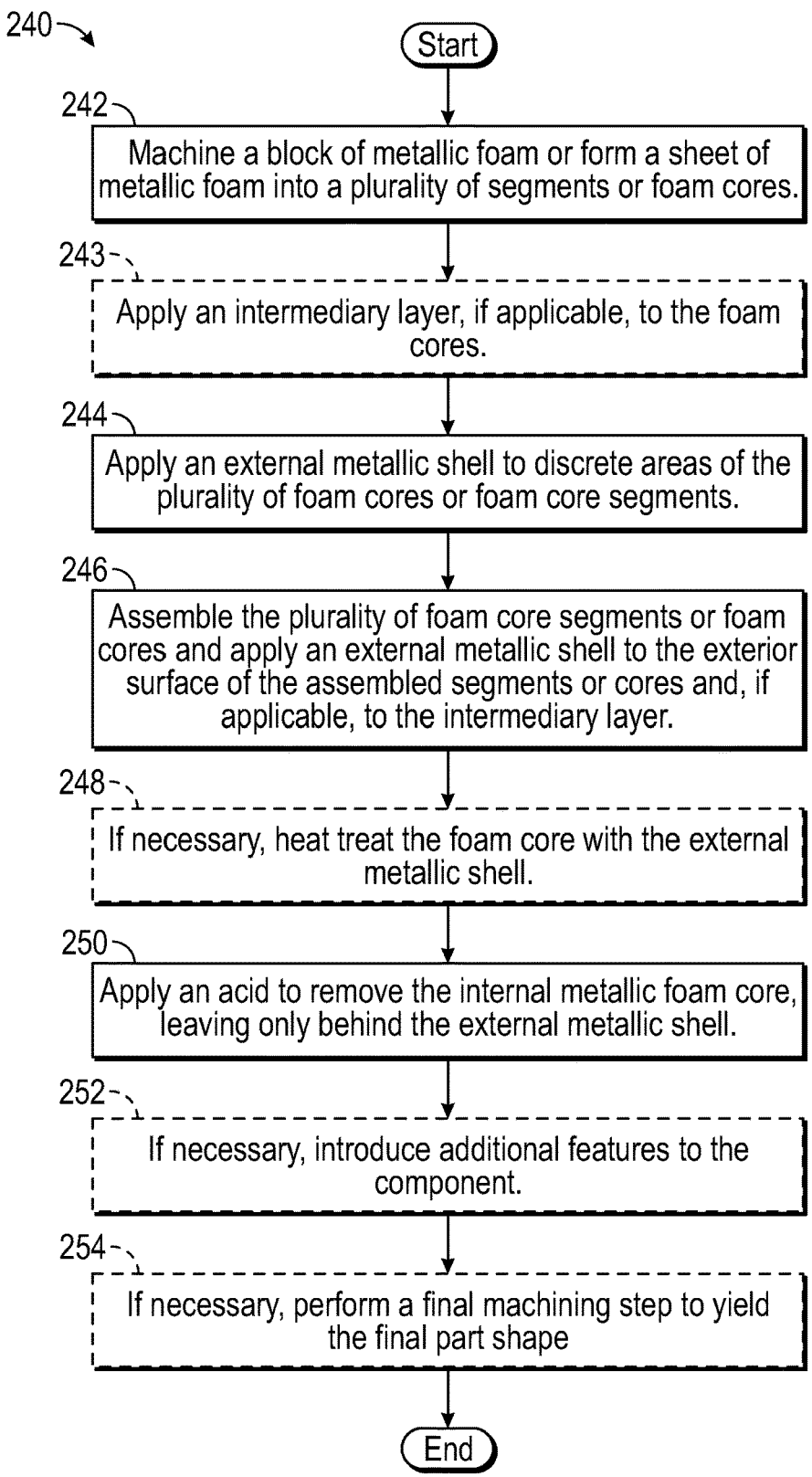
FIG. 27 is a flow chart illustrating an alternative method of making a component according to non-limiting methods of the present disclosure.

Referring now to FIG. 27, a flow chart 240 illustrating a method for forming a part or component 28 in accordance with various embodiments of the present disclosure is illustrated. At a first step 242, an unformed block of metallic foam 10 is machined to provide a plurality of foam core segments 82. As mentioned above, non-limiting machining processes include milling, grinding, electrical discharge machining (EDM), water-jet machining, laser machining, combinations thereof or any other process capable of machining the block 10 into the metallic foam core 11 having the component geometry 12. Alternatively and at the first step 242, a sheet of metallic foam 14 may be provided and the sheet of metallic foam 14 is formed into the foam core 11 having the desired part or component geometry 12 via a hot or cold forming process wherein the sheet of metallic foam 14 is placed into a die 16. The die 16 may include a pair of complementary halves 18 configured to form the desired part or component geometry 12.

Thereafter and at step 244, an external metallic shell 84 is applied to a discrete surface 86 or surfaces 86 of the preformed metallic foam cores 82. Thereafter and at step 246, the plurality of preformed metallic cores 82 are assembled to define a configuration or interior structure of the component 28 or the internal structure of the component 28 and the external metallic shell 20 is applied to the external surfaces of the assembled preformed metallic cores 82.

As a precursor to steps 244 and/or 246, an interim coat or applique may be applied to the foam core prior to the application of the external metallic shell 20, 84. This is illustrated as alternative step 243, which is illustrated in dashed lines. As mentioned above, the external metallic outer shell 20, 84 may be applied via any one of the aforementioned processes including but not limited to: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means.

Once the external metallic outer shell 20, 84 is applied to the exterior surface of the metallic foam pre-form or cores 82, they, may be further subjected to a heat treating step 248, which is illustrated in dashed lines as this step may not be required in all processes.

At step 250, the aforementioned acid 54 is applied and the metallic foam cores 82 are dissolved and removed from the component leaving only the external metallic shell 20 and the previous applied shell 84.

At step 252, additional features 26, if required, are introduced to the component 28. These additional features may be added by any suitable process such as milling, spot-face drilling, counter-bore drilling, conventional drilling, etc. In yet another embodiment, the part or component 28 may not require any additional features 26 to be added. In addition and as illustrated by the dashed lines in FIGS. 26 and 27, an alternative step 154. 254 may be provided wherein a final machining step of any key attachment, interface or functionally critical surfaces of the part or component occurs after step 150, 250. This would yield the final part shape.

As discussed herein various methods for producing light weight, low cost components and/or part are provided. Still further components and/or parts formed by the various methods are also provided.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method of making a light weight component, comprising:
   forming a metallic foam core into a desired configuration;
   inserting a pre-machined component into an opening in the metallic foam core;
   applying an external metallic shell to an exterior surface of the metallic foam core after it has been formed into the desired configuration and after the pre-machined component has been inserted into the metallic foam core;
   introducing an acid into an internal cavity defined by the external metallic shell;
   dissolving the metallic foam core; and
   removing the dissolved metallic foam core from the internal cavity, wherein the component and the external metallic shell are resistant to the acid.

2. The method as in claim 1, wherein the metal of the metallic foam core is formed from nickel and the external shell is nickel alloy and the acid is a nitric acid.

3. The method as in claim 1, wherein the metallic foam core is an open cell structure.

4. The method as in claim 1, wherein the metallic foam core is a closed cell structure.

5. The method as in claim 1, wherein the metallic foam core is formed into the desired configuration by a machining process selected from the group comprising: milling; grinding; electrical discharge machining (EDM); water-jet machining; and laser machining; and wherein the desired configuration is smaller than a final dimensions of the light weight component.

6. The method as in claim 1, wherein the metallic foam core is a sheet of metallic foam and the sheet of metallic foam is formed into the desired configuration by a hot or cold forming process wherein the sheet of metallic foam is placed in a die.

7. The method as in claim 6, wherein the metallic foam core is formed into the desired configuration by a machining process selected from the group comprising: milling; grinding; electrical discharge machining (EDM); water-jet machining; and laser machining after the hot or cold forming process.

8. The method as in claim 1, wherein the external metallic shell is deposited on the exterior surface of the metallic foam core via an application process selected from the group comprising: flame spray application process; plasma spray application process; cold-spray application process; electron beam physical vapor deposition (EB/PVD); chemical vapor deposition (CVD); electroplating application process, and wherein the external metallic shell is deposited about the entire exterior surface of the metallic foam core.

9. The method as in claim 1, wherein an interim coat is deposited on the exterior surface of the metallic foam core prior to the application of the external metallic shell.

10. The method as in claim 9, wherein the interim coat is a ceramic based thermal barrier coating.

11. The method as in claim 1, further comprising the step of: heat treating the metallic foam core after the external metallic shell has been applied to the exterior surface of the metallic foam core.

12. The method as in claim 1, further comprising the step of: forming additional features in the metallic foam core after the external metallic shell has been applied to the exterior surface of the metallic foam core.

13. The method as in claim 12, wherein the additional features are formed by a drilling process.

14. The method as in claim 13, wherein a supplemental application of the external metallic outer shell is applied to the metallic foam core after the drilling process.

15. The method as in claim 1, wherein a thickness of the external metallic outer shell varies in order to provide localized structural rigidity to the component.

16. The method as in claim 1, wherein the pre-machined component is a conduit.

17. A method of making a light weight component, comprising:
    forming a plurality of metallic foam core segments;
    applying a metallic shell to a discrete surface of at least one of the plurality of metallic foam core segments;
    assembling the plurality of metallic foam core segments into a desired configuration;
    applying an external metallic shell to an exterior surface of the metallic foam core segments after they have been placed into the desired configuration;
    introducing an acid into an internal cavity defined by the external metallic shell;
    dissolving the metallic foam core; and
    removing the dissolved metallic foam core from the internal cavity, wherein the metallic shell and the external metallic shell are resistant to the acid.

18. The method as in claim 17, wherein the metallic shell is surrounded by the external metallic shell.

* * * * *